United States Patent
Yu et al.

(10) Patent No.: US 9,253,913 B2
(45) Date of Patent: Feb. 2, 2016

(54) ELECTRONIC DEVICE WITH DISPLAY PANEL

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Long Yu, Shenzhen (CN); Yan-Bin Liu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 190 days.

(21) Appl. No.: 13/775,423

(22) Filed: Feb. 25, 2013

(65) Prior Publication Data

US 2013/0322028 A1 Dec. 5, 2013

(51) Int. Cl.
*H05K 7/14* (2006.01)
*H05K 5/00* (2006.01)
(Continued)

(52) U.S. Cl.
CPC ............ *H05K 7/1461* (2013.01); *G06F 1/1626* (2013.01); *G06F 1/1637* (2013.01); *H04M 1/0249* (2013.01); *H04M 1/0266* (2013.01);
(Continued)

(58) Field of Classification Search
CPC ......... H05K 7/14; H05K 5/00; H05K 7/1422; H05K 5/006; H05K 5/0004; H05K 7/00; H05K 7/1461; H05K 5/0017; G06F 1/1607; G06F 1/1616; G06F 1/1626; G06F 1/37

USPC ................ 361/728–730, 715, 756, 727, 800, 361/679.01, 679.02, 679.21, 679.29, 361/679.33, 679.55, 741; 29/592.1, 29/825–832, 852–854; 312/223.2, 223.3, 312/236; 349/58, 59, 60
See application file for complete search history.

(56) References Cited

U.S. PATENT DOCUMENTS 4,111,533 A * 9/1978 Nakamura ........ G02F 1/133528
349/58
6,118,436 A * 9/2000 Kushita ................. G06F 1/1616
341/20

(Continued)

FOREIGN PATENT DOCUMENTS

| JP | 411259010 A1 * | 9/1999 | ............... G09F 9/00 |
| TW | 200821671 A | 10/2004 | |
| TW | 494354 B | 7/2012 | |

*Primary Examiner* — Michail V Datskovskiy
(74) *Attorney, Agent, or Firm* — Novak Druce Connolly Bove + Quigg LLP (57) ABSTRACT

An electronic device includes a housing and a functional module received in the housing. The housing includes a bottom wall, two sidewalls extending from opposite sides of the bottom wall, and two connecting walls. Each of the connecting walls extends from an edge of each sidewall away from the bottom wall and bends towards to the other of the connecting walls. The bottom wall, the sidewalls and the connecting walls cooperatively form a receiving space having at least one opening. The functional module includes a fixing frame positioned adjacent to the bottom wall, a circuit board positioned on the fixing frame, and a display panel positioned on circuit board away from the fixing frame and electrically connected with the circuit board. The fixing frame is capable of being slidably pushed into the housing via the at least one opening together with the circuit board and the display panel.

20 Claims, 7 Drawing Sheets

(51) Int. Cl.
  *G06F 1/16*  (2006.01)
  *H04M 1/02*  (2006.01)
(52) U.S. Cl.
  CPC ........... *H04M 1/0277* (2013.01); *H05K 5/0017* (2013.01)

(56) References Cited

U.S. PATENT DOCUMENTS

| | | | | |
|---|---|---|---|---|
| 6,747,713 | B1 * | 6/2004 | Sato | 349/58 |
| 6,768,523 | B2 * | 7/2004 | Cheng | H04M 1/0266 348/837 |
| 7,586,751 | B2 * | 9/2009 | Ho | G02F 1/133308 361/752 |
| 7,623,341 | B1 * | 11/2009 | Salvat | G06F 1/1607 345/905 |
| 7,724,532 | B2 | 5/2010 | Zadesky et al. | |
| 7,894,185 | B2 * | 2/2011 | Weber | G06F 1/1626 361/679.56 |
| 8,146,244 | B2 * | 4/2012 | Zadesky | H04M 1/0202 174/535 |
| 8,385,060 | B2 * | 2/2013 | Dabov | G06F 1/1626 29/832 |
| 8,432,676 | B2 * | 4/2013 | Tracy | G06F 1/1616 29/592 |
| 8,893,373 | B2 * | 11/2014 | Rothkopf | G06F 1/1637 29/592.1 |
| 2006/0028594 | A1 * | 2/2006 | Chou | G02F 1/133308 349/58 |
| 2006/0268528 | A1 | 11/2006 | Zadesky et al. | |
| 2009/0052145 | A1 * | 2/2009 | Kim et al. | 361/728 |

\* cited by examiner

ELECTRONIC DEVICE WITH DISPLAY PANEL

BACKGROUND

1. Technical Field

The present disclosure generally relates to electronic devices, and particularly to an electronic device with a display panel.

2. Description of the Related Art

Electronic devices with a display panel, such as mobile phones, computers, media players are popular. A housing of the electronic device includes a front shell and a rear shell. In assembly, a fixing frame, a circuit board, a display panel and other functional members or components of the electronic device are put into the rear shell in order. The front shell is mounted on the rear shell via fasteners to close the housing. Therefore, assembly and disassembly of the electronic device may be complex and inconvenient.

Therefore, there is room for improvement within the art.

BRIEF DESCRIPTION OF THE DRAWING

The components in the drawings are not necessarily drawn to scale, the emphasis instead placed upon clearly illustrating the principles of the present disclosure.

Moreover, in the drawings, like reference numerals designate corresponding parts throughout the several views.

DETAILED DESCRIPTION

Figure 1:
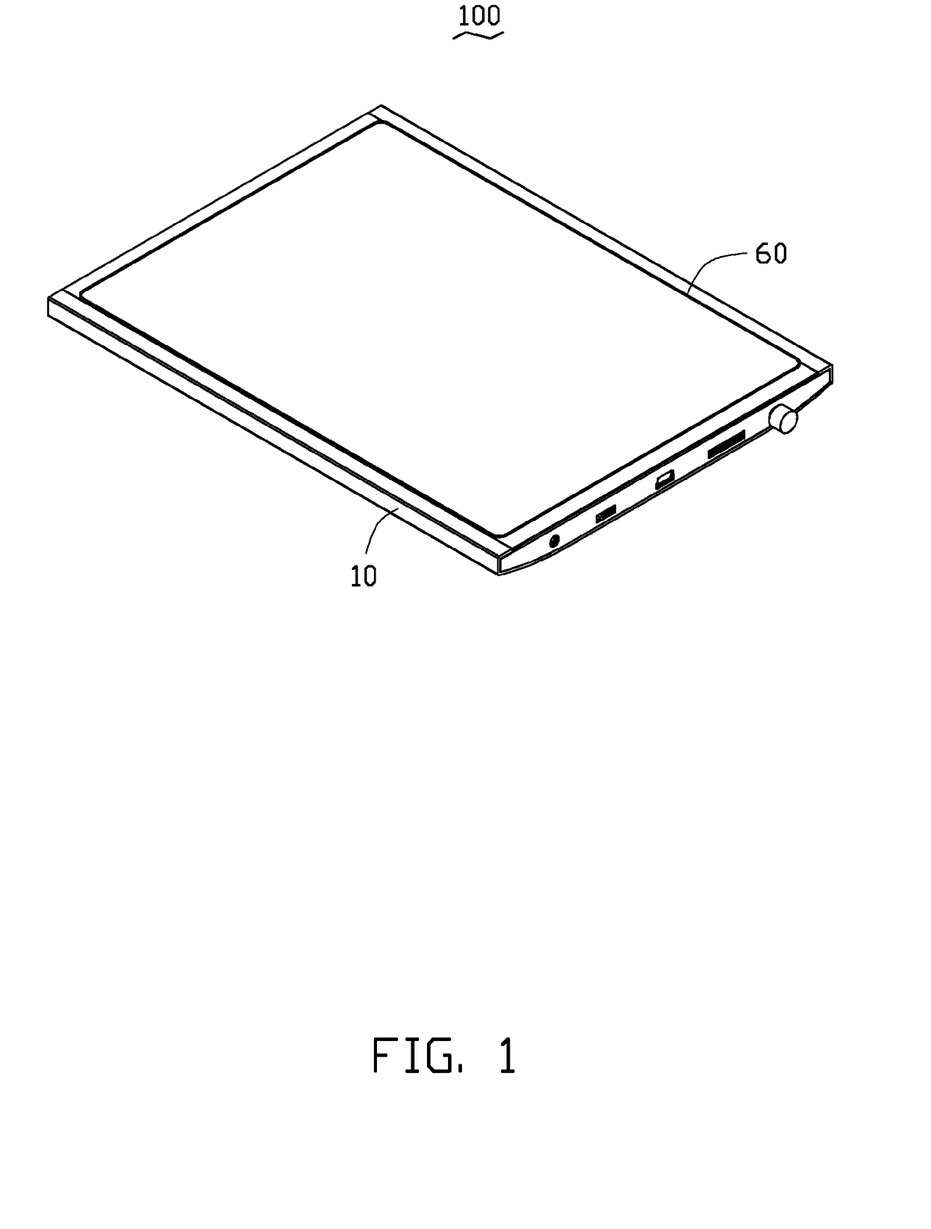
FIG. 1 shows an isometric view of an electronic device in accordance with a first embodiment of the present disclosure.

Referring to FIG. 1, a first embodiment of an electronic device 100 may be a panel computer, an e-book, a media player or other electronic devices with display function. In the illustrated embodiment, the electronic device 100 is a panel computer.

Figure 2:
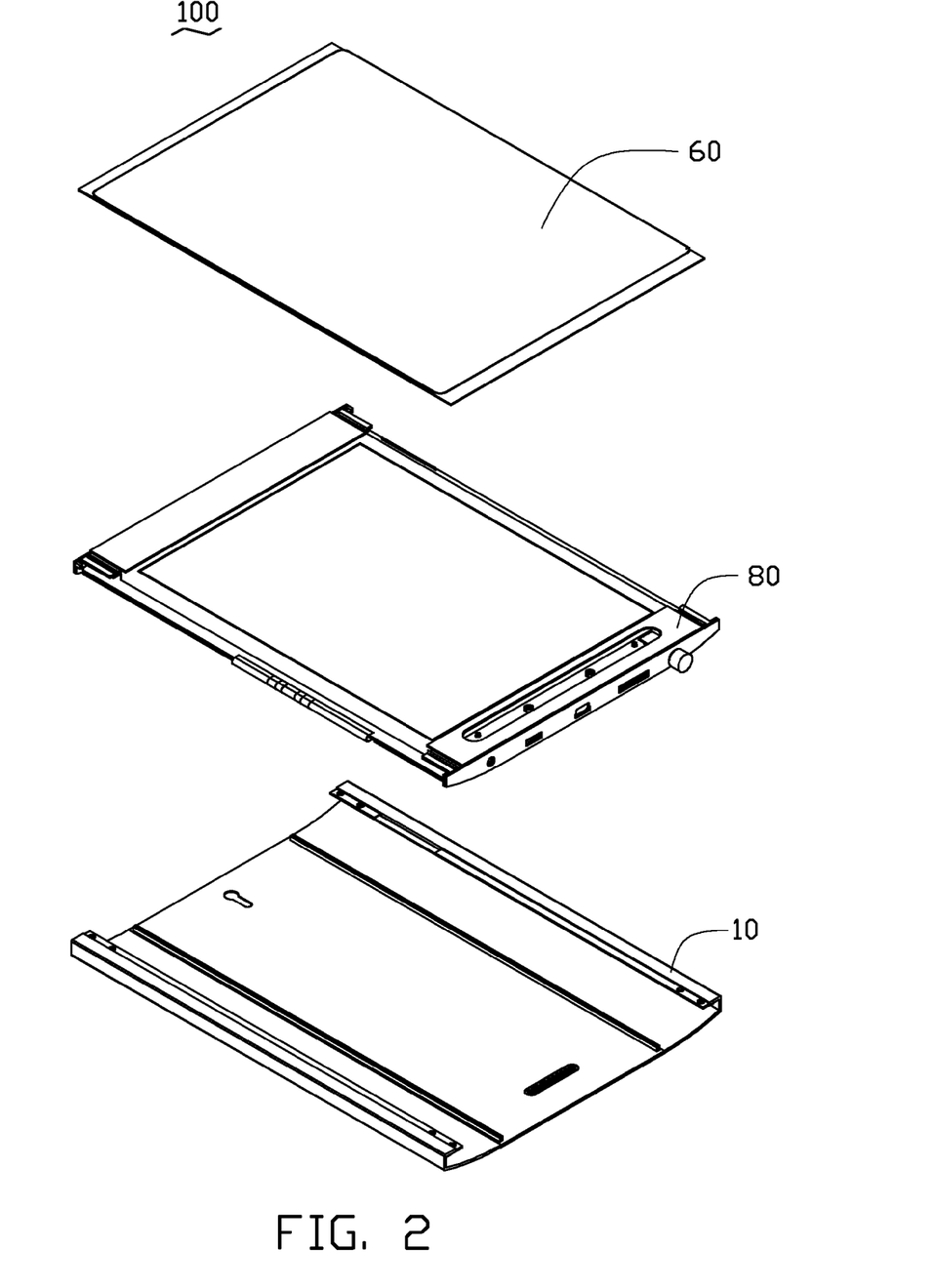
FIG. 2 is a partially exploded, isometric view of the electronic device of FIG. 1.
Figure 3:
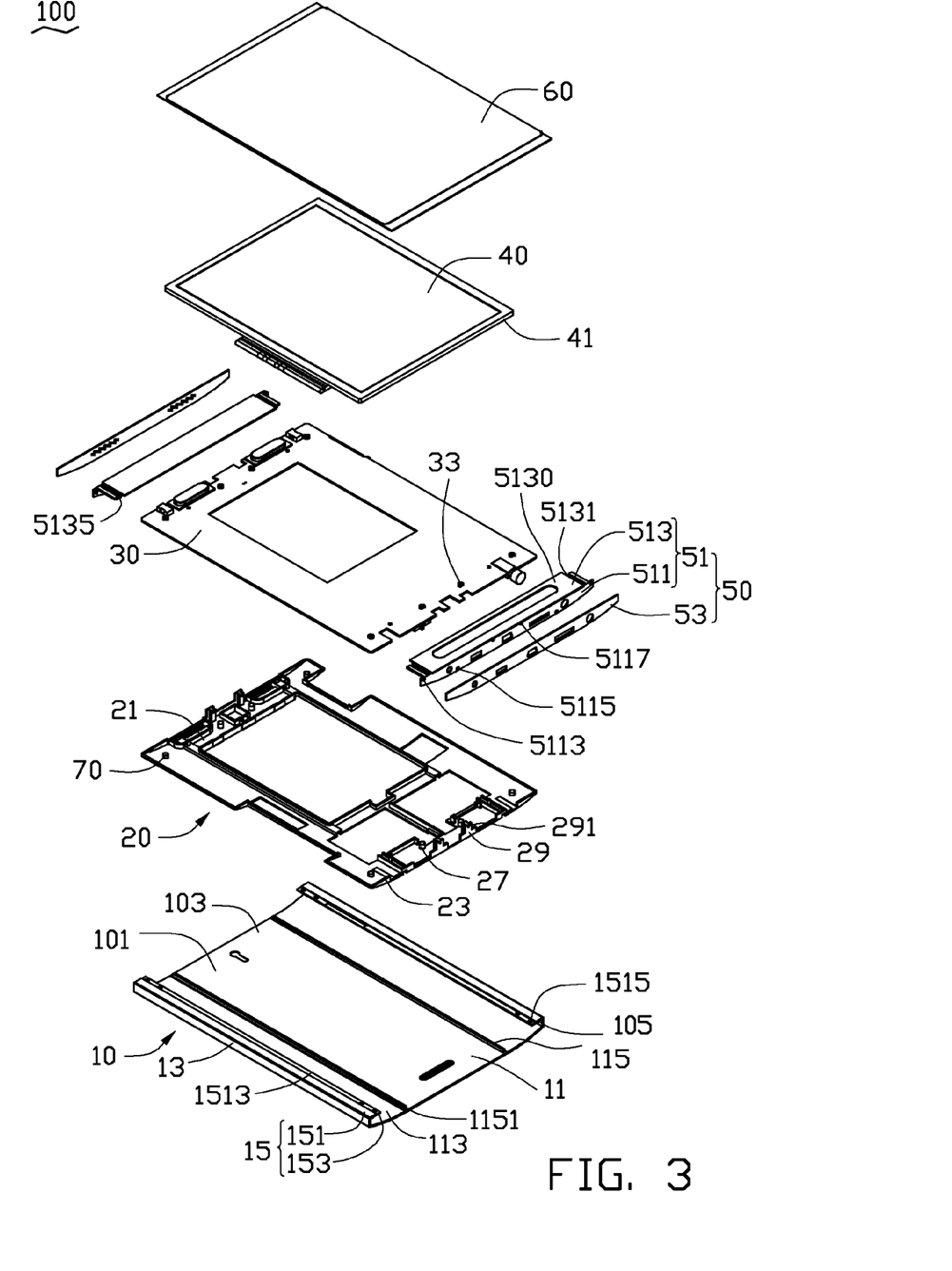
FIG. 3 is an exploded, isometric view of the electronic device of FIG. 2.
Figure 4:
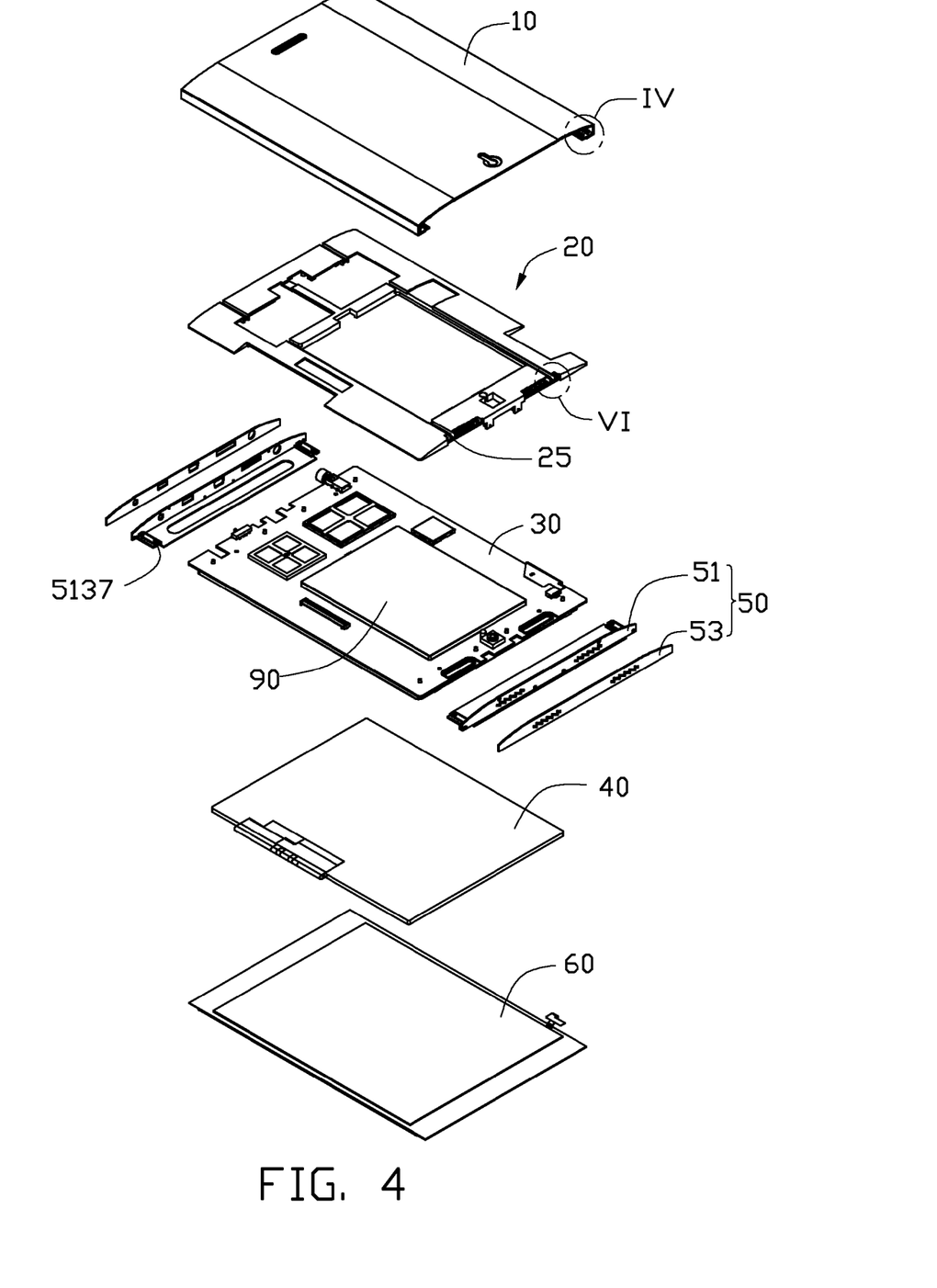
FIG. 4 is similar to FIG. 3, but viewed from another aspect.

Referring to FIGS. 2 to 4, the electronic device 100 includes a housing 10, a functional module 80 mounted in the housing 10, and a protect panel 60. The functional module 80 includes a fixing frame 20, a circuit board 30, a display panel 40, a mounting assembly 50, and a plurality of fixing members 70. The fixing frame 20 is detachably positioned in the housing 10. The circuit board 30 and the display panel 40 are stacked on the fixing frame 20 and are electrically connected with each other. The circuit board 30 is sandwiched between the display panel 40 and the fixing frame 20. The mounting assembly 50 are positioned on two ends of the fixing frame 20 via the fixing members 70, and fixedly assembled with the housing 10 for closing the functional module 80 in the housing 10. For simplicity sake, other functional components of the functional module 80 are not described here, such as a battery, a camera, and so on. The protect panel 60 is positioned on the housing 10 above the display panel 40.

Figure 5:
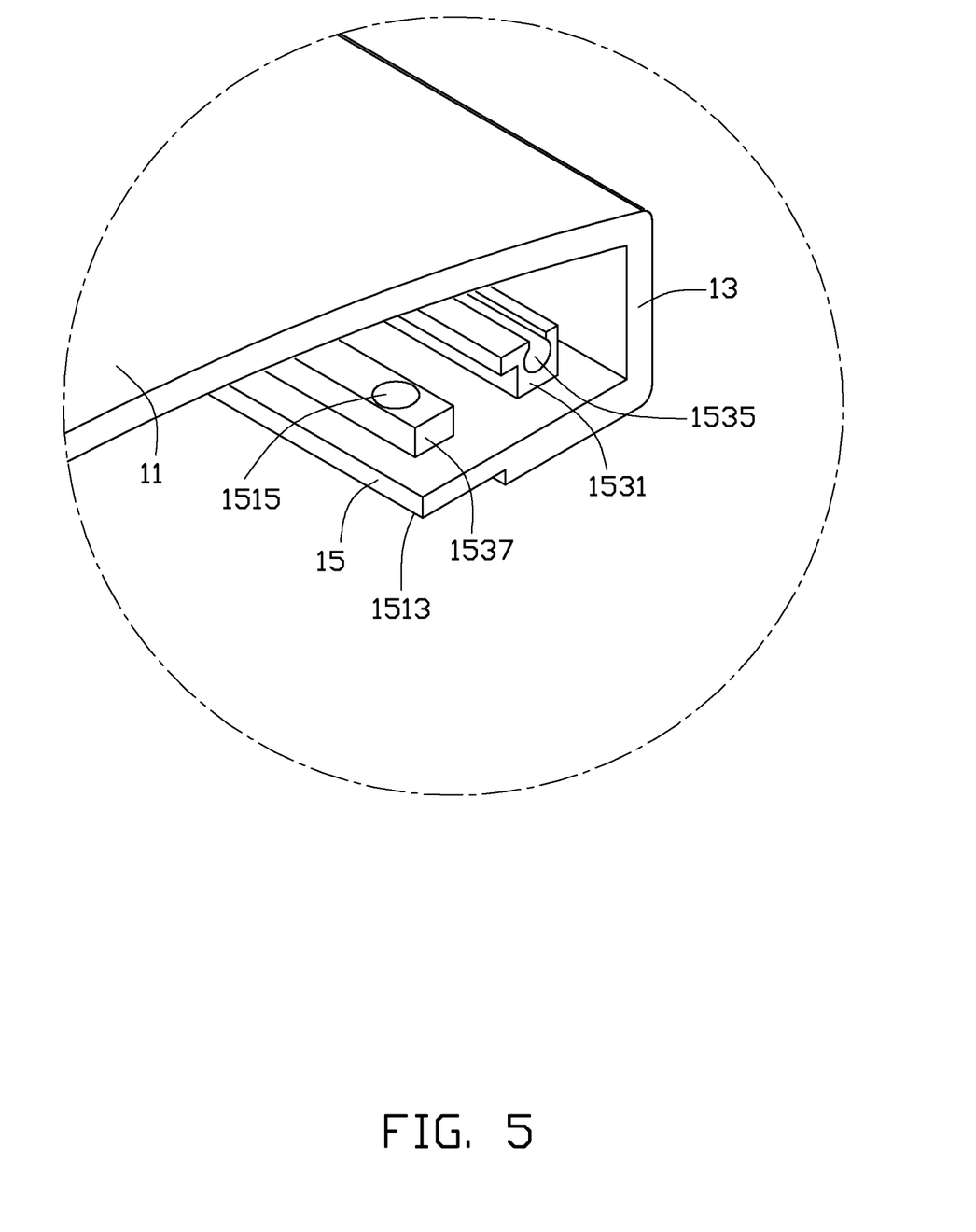
FIG. 5 is an enlarged view of IV circled portion of FIG. 4.
Figure 6:
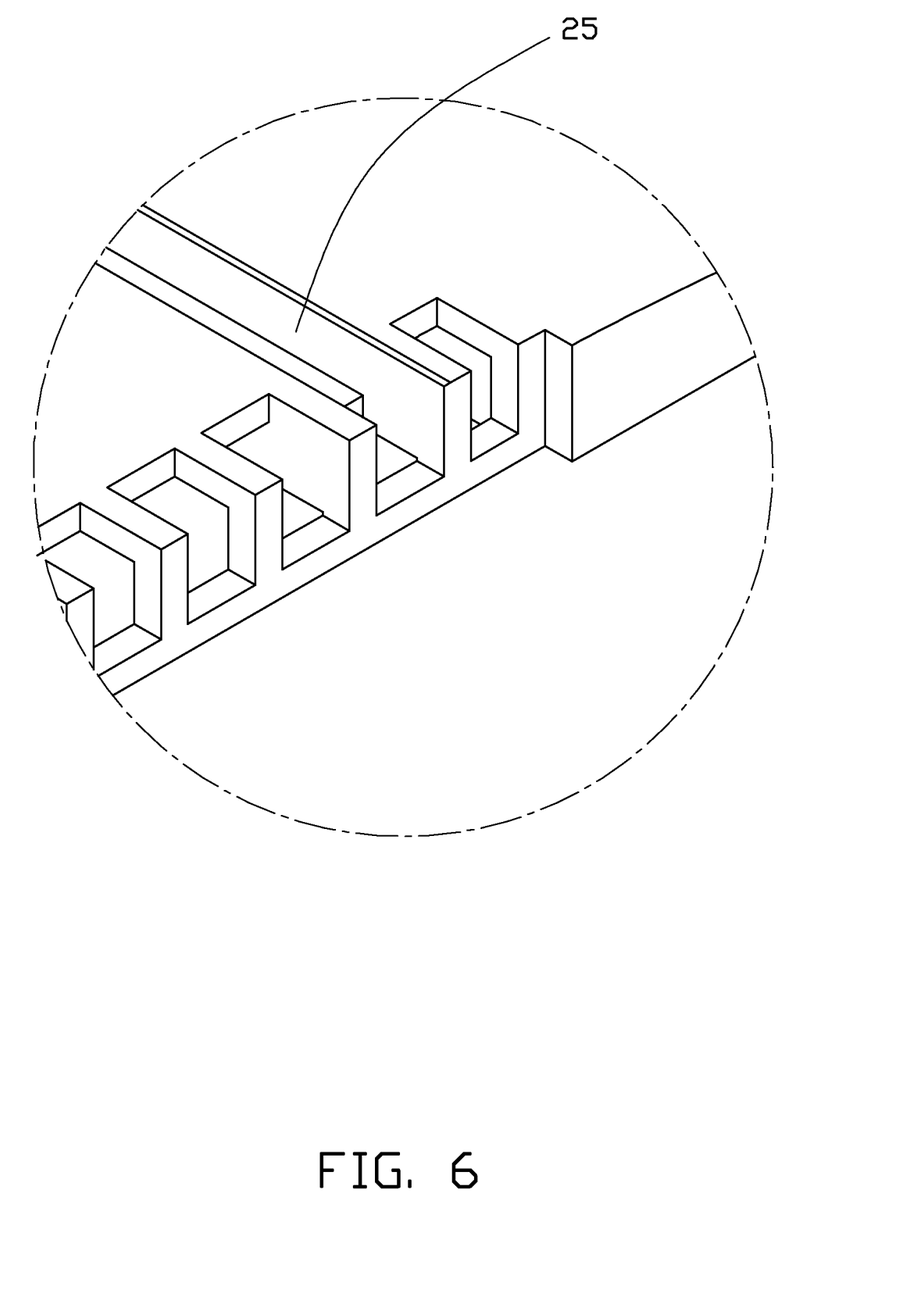
FIG. 6 is an enlarged view of VI circled portion of FIG. 4.

Also referring to FIG. 5, the housing 10 is integrated formed, including a bottom wall 11, two sidewalls 13 extending from opposite sides of the bottom wall 11 by bending, and two connecting walls 15. Each of the connecting walls 15 is formed at an edge of the sidewalls 13 away from the bottom wall 11 and substantially parallel to the bottom wall 11. The bottom wall 11, the sidewalls 13 and the connecting walls 15 cooperatively form a receiving space 101 to receive the functional module 80. Two openings 103 are formed on two ends of the receiving space 101. The bottom wall 11 is substantially a board. Two position portions 113 are substantially arc-shaped, which are formed by bending the two sides of the bottom wall 11 adjacent to the sidewalls 13. One guiding rail 115 is formed on an inner surface of each of the position portions 113 along a length direction of the housing 10. A first fixing hole 1151 is formed in each end surface of the guiding rail 115. Each of the connecting walls 15 includes an outer surface 151 and an inner surface 153 opposite to the outer surface 151. The inner surface 153 faces the bottom wall 11. A first step 1513 is formed on an edge of each of the connecting walls 15 away from each of the sidewalls 13. Two mounting holes 1515 are defined in each end of the first step 1513, and positioned adjacent to the openings 103. A sliding rail 1531 is formed on each of the inner surface 153 along the length direction of the housing 10 and is substantially parallel to the guiding rails 115. A first fastening hole 1535 is formed in each end surface of the sliding rail 1531. A striped guiding block 1537 is formed on the inner surface 153 apart from the sliding rail 1531 away from each of the sidewalls 13, and substantially parallel to the sliding rails 1531. In the illustrated embodiment, the housing 10 is formed by aluminum extrusion method. In other embodiments, only one of the openings 103 can be positioned in the housing 10. The two sides of the bottom wall 11 adjacent to the sidewalls, the sidewalls 13, and the connecting walls 15 cooperatively form two location grooves 105. In other embodiments, the connecting walls 15 can be omitted, each of the sidewalls 13 extends bending from an edge of the bottom wall 11 towards to the other sidewall 13 and cooperates with the bottom wall 11 to form the location groove 105.

The fixing frame 20 includes opposite fixing ends 21 corresponding to the two openings 103. Two location portions 23 are formed on the fixing frame 20 corresponding to the position portions 113. Each of the location portions 23 is received one corresponding position portion 113. A sliding groove 25 is defined in a surface of each of the location portions 23 facing toward the bottom wall 11. Each of the guiding rails 115 is received in a corresponding sliding groove 25. Two guiding posts 27 are positioned on a surface of the fixing frame 20 away from the bottom wall 11, and positioned apart on a middle of each of the fixing ends 21 for guiding the circuit board 30 in assembly. Two fixing slices 29 are protruded from an edge of the surface deviating from the bottom wall 11 and are positioned adjacent to the guiding posts 27. A first connecting hole 291 is defined in each of the fixing slices 29 to connect to the mounting assembly 50.

Four guiding holes 33 are defined in the circuit board 30 corresponding to the four guiding posts 27. The circuit board 30 sleeves on the four guiding posts 27 via the guiding holes 33. The display panel 40 includes opposite resisting ends 41. The display panel 40 is positioned above the circuit board 30, and positioned between the two guiding block 1537 of the housing 10.

The mounting assembly 50 includes two mounting members 51 and two close members 53. Each of the mounting members 51 is positioned on one of the fixing ends 21, fixedly connected with the two fixing slices 29 of each of the fixing ends 21, and partly covering the display panel 40 to fix the functional module 80 with the housing 10. Each of the close members 53 is adhered to one of the mounting members 51 for closing the housing 10.

Each of the mounting members 51 includes a mounting portion 511 and a connecting portion 513 substantially perpendicularly extending from one side of the mounting portion 511. A shape of the mounting portion 511 is fitting with a shape of the opening 103 to close the housing 10. The mounting portion 511 is fixedly connected with the sliding rails 1531. A second fastening hole 5113 is defined in each end of the mounting portion 511 adjacent to the sidewall 13 corresponding to the first fastening hole 1535 to connect with the sliding rail 1531 via one of the fixing members 70. Two second fixing holes 5115 away from the connecting portion 513 is defined in the mounting portion 511 corresponding to the first fixing holes 1151 to connect with the guiding rails 115. Two second connecting holes 5117 are defined in middle of the mounting portion 511 corresponding to the first connecting holes 291, and positioned in a middle of the mounting portion 511 adjacent to the connecting portion 513. The connecting portion 513 includes a main body 5130 and two second steps 5131 substantially perpendicularly extending formed from two ends of the main body 5130. The main body 5130 is positioned above the display panel 40, and the second step 5131 is positioned under the first step 1513. A part of the second step 5131 away from the mounting portion 511 resists against the resisting ends 41 of the display panel 40 to prevent the display panel 40 from loosen. A loading groove 5135 is defined in each of the second steps 5131 to receive the sliding rail 1531. Two mounting holes 5137 (as shown in FIG. 4) are defined in a bottom surface of each of the loading groove 5135.

The protective panel 60 is mounted on a surface of the first steps 1513 deviating from the receiving space 101 and is positioned above the display panel 40 to protect the display panel 40. Users can operate the electronic device 100 via the protective panel 60. In the illustrated embodiment, the protective panel 60 is adhered to the first steps 1513 via glue.

In assembly, the circuit board 30 sleeves on the guiding posts 27 and is fixed with the fixing frame 20. The display panel 40 is positioned on the circuit board 30, and electrically connected with the circuit board 30. Two of the fixing members 70 respectively pass through the second connecting holes 5117 and the first connecting holes 291. Then one of the mounting members 51 is connected with one of the fixing ends 21 of the fixing frame 20. Another one of the fixing ends 21 without mounting portion 511 is arranged with one of the openings 103 of the housing 10. Then the functional module 80 is slidably pushed into the housing 10 and received the housing 10 via the opening 103. Another one of the mounting members 51 is mounted on the other fixing end 21 at other opening 103. The mounting members 51 are fastened with the guiding rails 115 and the sliding rails 1531 via the fixing members 70. The two close members 53 are respectively fixed on the two mounting portions 511. The protective panel 60 is mounted on the first steps 1513.

Figure 7:
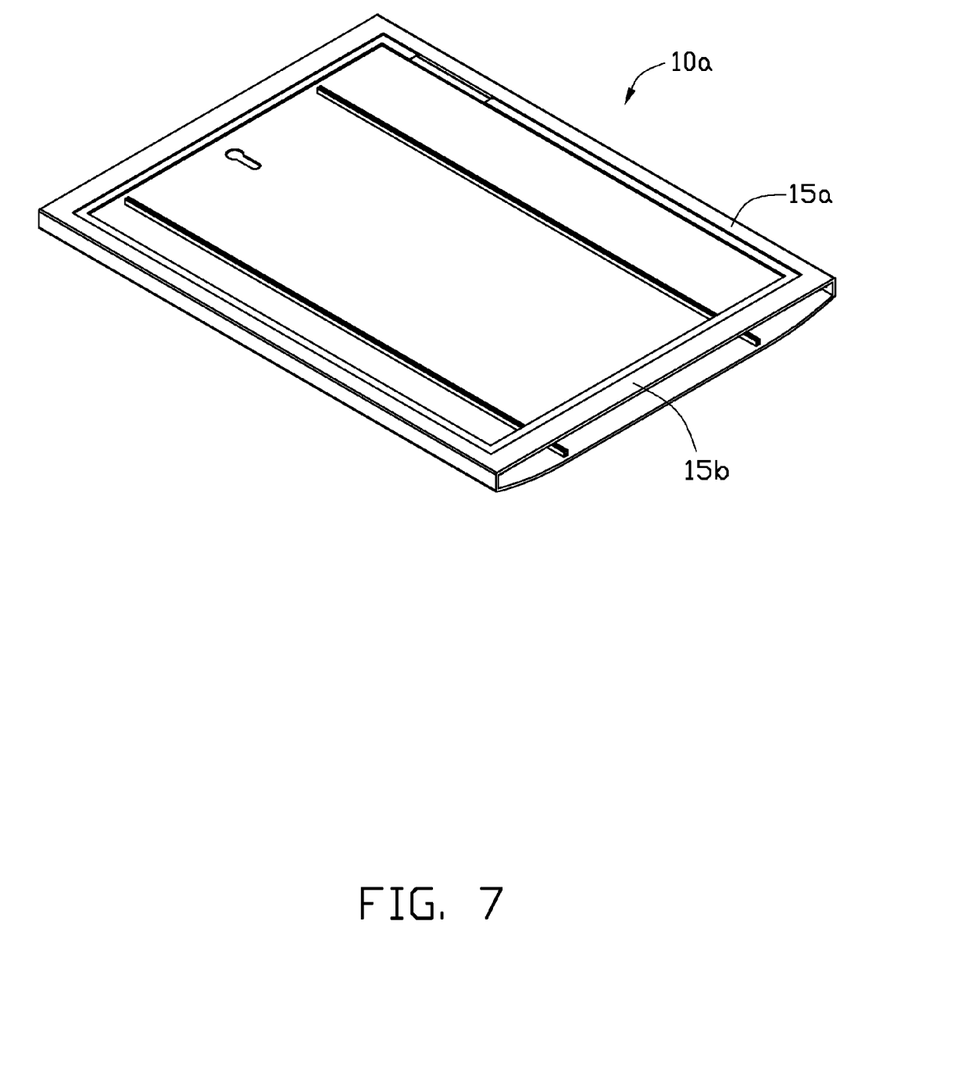
FIG. 7 shows an isometric view of an electronic device in accordance with a second embodiment of the present disclosure.

Function and structure of an electronic device (not shown) in a second embodiment is similar to the electronic device 100 of the first embodiment. The difference of the electronic device is the two connecting walls 15a (as shown in FIG. 7) substantially perpendicularly connected by two strengthen walls 15b to form a top wall in a frame shape. The two strengthen walls 15b are configured for strength the housing 10.

The housing 10 is an integrated body having openings 103. In assembly, the fixing member 70, the circuit board 30, the mounting assembly 50, the display panel 40 and other functional components are firstly assembled as an entire body of the functional module 80. Secondly, the functional module 80 is slidably pushed into the housing 10 along the two location grooves 105 via one opening 103. Thus, it is convenient for assembly. The sliding rails 1531 and the guiding rails 115 are formed in the housing 10, the sliding groves 25 are formed in the fixing frame 20 corresponding to the guiding rails 115, and the loading grooves 5135 are formed in the second step 5131 for guiding the slide of functional module 80 relative to the housing 10. The position portions 113 of the housing 10 and the location portions 23 of the fixing frame 20 help the positions of the fixing frame 20 in assembly. In traditional assembly of electronic devices, different kinds of plastic members are needed to fasten different kinds of functional components. In contrast, only one kind of the fixing members 70 is applied in the electronic device 100 assembly. Thus, cost of molds to made different kinds of plastic members can be saved.

In other embodiments, the mounting assembly 50 can be omitted, the resisting ends 41 resist against or mounted with the fixing ends 21 respectively, the fixing members 70 are fastened with the housing 10 and the fixing frame 20 directly.

In other embodiments, the two mounting members 51 are fixed with the fixing frame 20 after the fixing frame 20 is received in the housing 10, or the two mounting members 51 are fixed at two of the fixing ends 21 before the functional module 80 slide into the housing 10.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. An electronic device comprising:
a housing comprising a bottom wall, two sidewalls extending from opposite sides of the bottom wall, and two connecting walls, each of the connecting walls extending from an edge of each sidewall away from the bottom wall and bending towards the other of the connecting walls, wherein the bottom wall, the two sidewalls and the two connecting walls cooperatively form a receiving space having at least one opening; and
a functional module detachably mounted and received in the housing, the functional module comprising:
a fixing frame positioned adjacent to the bottom wall;
a circuit board positioned on the fixing frame away from the bottom wall; and
a display panel positioned on the circuit board away from the fixing frame and electrically connected with the circuit board,
wherein the fixing frame is capable of being slidaly pushed into the housing via the at least one opening together with the circuit board and the display panel to be detachably assemble within the housing, the electronic device further comprises a protective panel mounted on the connecting walls, the functional module is totally received in the receiving space, the functional module is sandwiched between the protective panel and the bottom wall, the display panel is under the connecting wall.

2. The electronic device of claim 1, wherein at least one guiding rail is formed on the bottom wall facing towards the fixing frame, the fixing frame forms at least one sliding groove corresponding to the at least one guiding wall, and the guiding rail is received in the sliding groove.

3. The electronic device of claim 1, wherein the functional module further comprises two mounting members, and each mounting member is mounted at one end of the fixing frame.

4. The electronic device of claim 3, wherein each mounting member comprises a mounting portion and a connecting portion substantially perpendicularly extending from one side of the mounting portion, the mounting portion is mounted at the end of the fixing frame, and the connecting portion is positioned above the display panel.

5. The electronic device of claim 4, wherein two fixing slices are protruded from each end of the fixing frame and are positioned on a surface deviating from the bottom wall, and each mounting portion is fixed with the two fixing slices.

6. The electronic device of claim 4, wherein each connecting wall comprises an outer surface and an inner surface opposite to the outer surface, and the inner surface faces to the bottom wall.

7. The electronic device of claim 6, wherein a sliding rail is formed on the inner surface of each connecting wall, loading grooves are formed in the connecting portion, and each sliding rail is received in one corresponding loading groove.

8. The electronic device of claim 6, wherein a guiding block is positioned on the inner surface of each connecting wall away from the sidewall, and the display panel is resisted between the two guiding blocks.

9. The electronic device of claim 1, wherein a first step is formed at an edge of each connecting wall away from the sidewall, and the protective panel is mounted on the first step.

10. The electronic device of claim 1, wherein the housing further comprises two strengthen walls, the two connecting walls are substantially perpendicularly connected by the two strengthen walls to form a top wall in a frame shape.

11. The electronic device of claim 1, wherein the bottom wall comprises at least one substantially arc-shaped position portion, the fixing frame comprises at least one location portion positioned on a surface of the fixing frame facing toward the bottom wall corresponding to the at least one position portion, and the least one location portion is received in the at least one position portion.

12. An electronic device comprising:
an integrated made housing comprising a bottom wall and two sidewalls extending bending from opposite edges of the bottom wall, each sidewall cooperating with the bottom wall to form a location groove; and
a functional module detachably mounted and received in the housing, the functional module comprising:
a fixing frame positioned adjacent to the bottom wall comprising:
a circuit board positioned on the fixing frame away from the bottom wall; and
a display panel positioned on the circuit board away from the fixing frame and electrically connected with the circuit board,
wherein the fixing frame is capable of being slidaly pushed into the housing along the two location grooves together with the circuit board and the display panel to be detachably assembled within the housing, the electronic device further comprises a protective panel mounted on the housing, the functional module is totally received in the receiving space, the functional module is sandwiched between the protective panel and the bottom wall, the display panel is under sidewalls of the location grooves.

13. The electronic device of claim 12, wherein the bottom wall comprises at least one substantially arc-shaped position portion, the fixing frame comprises at least one location portion positioned on a surface of the fixing frame facing towards the bottom wall corresponding to the at least one position portion, and the least one location portion is received in the at least one position portion.

14. The electronic device of claim 13, wherein the at least one position portion comprises at least one guiding rail facing towards the fixing frame, the at least one location portion comprises at least one sliding groove corresponding to the at least one guiding rail, and the at least one guiding rail is received in the at least one sliding groove.

15. The electronic device of claim 12, wherein the functional module further comprises two mounting members, and each mounting member is mounted at one end of the fixing frame.

16. The electronic device of claim 15, wherein each mounting member comprises a mounting portion and a connecting portion substantially perpendicularly extending from one side of the mounting portion, the mounting portion is mounted at the end of the fixing frame, and the connecting portion is positioned above the display panel.

17. The electronic device of claim 16, wherein the fixing frame comprises two fixing slices protruded from each end of the fixing frame and positioned on a surface deviating from the bottom wall, and each mounting portion is fixed with the two fixing slices.

18. The electronic device of claim 16, wherein the housing further comprising two connecting walls, each of the connecting walls extending from an edge of each sidewall away from the bottom wall and substantially parallel to the bottom wall, the protective panel is mounted on the connecting walls.

19. The electronic device of claim 18, wherein each connecting wall comprises an outer surface and an inner surface opposite to the outer surface, and the inner surface faces to the bottom wall, a sliding rail is formed on the inner surface of each connecting wall, and each sliding rail is received in one corresponding loading groove.

20. The electronic device of claim 18, wherein a guiding block is positioned on the inner surface of each connecting wall away from the sidewall, and the display panel is resisted between the two guiding blocks.

* * * * *